(12) United States Patent
Seeber et al.

(10) Patent No.: US 7,190,170 B1
(45) Date of Patent: Mar. 13, 2007

(54) PARTICLE DOPED MAGNETIC COIL

(75) Inventors: Derek Allan Seeber, Florence, SC (US); Timothy John Havens, Florence, SC (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/277,387

(22) Filed: Mar. 24, 2006

(51) Int. Cl.
*G01R 31/00* (2006.01)
*G01V 3/00* (2006.01)

(52) U.S. Cl. ...................... 324/411; 324/318
(58) Field of Classification Search ........... 324/411, 324/318; 600/410
See application file for complete search history.

(56) References Cited

U.S. PATENT DOCUMENTS 6,972,567 B2 * 12/2005 Havens et al. ............. 324/318
6,992,483 B1 * 1/2006 Emeric et al. ............. 324/300
2005/0168222 A1 * 8/2005 Arz et al. .................. 324/318

OTHER PUBLICATIONS

Roy, M. et al. "The Influence of Physical and Chemical Linkage on the Properties of Nanoparticles." 2005 CEIPD Conference, Oct. 2005. Nashville, TN.
Imali, Takahiro et al. "The insulation properties of Nano and Micro Filler Mixture Composite." 2005 CEIPD Conference, Oct. 2005. Nashville, TN.

* cited by examiner

*Primary Examiner*—Andrew H. Hirshfeld
*Assistant Examiner*—Timothy J Dole
(74) *Attorney, Agent, or Firm*—Ziolkowski Patent Solutions Group, SC; Michael A. Della Penna; Carl B. Horton

(57) ABSTRACT

A system and method for decreasing partial discharge between adjacent conductive plates includes suspending a plurality of particles in the space between adjacent plates of a magnetic coil. The plurality of particles are generally uniformly dispersed in the space and allow for increased partial discharge inception voltages. Such a construction allows the coil to operate at elevated driving voltages with reduced partial discharge between adjacent plates.

18 Claims, 2 Drawing Sheets

PARTICLE DOPED MAGNETIC COIL

BACKGROUND OF THE INVENTION

The present invention relates generally to magnetic coil construction and, more particularly, to a method of reducing partial discharge between adjacent conductive layers of the coil and increasing a bore radius and coil operating voltages.

Electromagnetic coils have applications across a wide spectrum of industry. Electromagnetic coils have applications in transportation systems such as maglev trains, electrical power systems in devices such as transformers, and medical imaging technologies such as magnetic resonance imagining or MRI systems. Construction of the coil is directly related to the ultimate application of the coil and directly effects operation of the coil and performance of the system which utilizes the coil.

In the medical imaging field, the construction of the coil is an important consideration to the construction and operation of the medical imaging device. The coil generally consists of a plurality of conductive plates adhered together and shaped to define a bore. During imaging of a patient, the patient is passed into the bore of the imaging device. Some patients are apprehensive about the relatively closed space of the bore of the coil. This apprehension can detrimentally affect patient physiology which in turn detrimentally affects image quality and/or integrity. Accordingly, it would be desirable to expand the area of the bore of the coil to minimize patient anxiety associated with the scanning process. Furthermore, increasing the size of the bore of the coil provides for imaging of subjects/parcels with larger cross-sectional areas.

The size of the bore opening can be increased without increasing the overall size of the imaging device by reducing the spacing between adjacent conductive plates of the coil. However, decreasing this interlayer spacing increases the partial discharge between adjacent layers of the coil. As explained further below, in magnetic resonance imaging applications, increased partial discharge between layers of the coil negatively affects image quality.

Another consideration is the coils ability to function at operating parameters which are continually increasing. Particularly in the imaging field, providing a device capable of generating stronger gradients and/or faster slew rates provides for increased imaging functionality and improved device throughput. In order to generate the stronger gradients and the faster slew rates, the conductive plates of the coil are subjected to ever increasing operating voltages. These increased voltages also affect the partial discharge between adjacent layers of the coil. As the spacing between adjacent plate's decreases and the plates are subjected to increased operating voltages, there is a greater probability of increased partial discharge between adjacent layers of the coil.

In magnetic resonance imaging applications, partial discharge between layers of the coil causes white pixels thereby affecting imaging quality. Increasing the bore size, thereby decreasing the interlayer spacing between adjacent layers of the coil, increases the probability of partial discharge between adjacent layers and thereby detrimentally affects image quality. Increasing the operating voltage of the coil also increases the partial discharge between adjacent layers thereby detrimentally affecting image quality. Understandably, increasing the bore size as well as the operational power range of the imaging device compounds the detrimental effects of partial discharge between plates of the coil and detracts from image quality.

It would therefore be desirable to have a system and method capable of providing a coil with an increased bore diameter and constructed to operate at elevated power levels without detrimentally affecting the partial discharge of the coil.

BRIEF DESCRIPTION OF THE INVENTION

The present invention provides a coil and method of forming a coil which overcomes the aforementioned drawbacks. The present invention provides a system and method of reducing the spacing between adjacent conductive layers of the coil without increasing the partial discharge between adjacent layers of the coil.

According to one aspect of the present invention, an electromagnetic coil is disclosed which includes a first conductor, a second conductor, and an epoxy disposed therebetween. A plurality of particles is generally uniformly suspended in the epoxy and increase a partial discharge inception voltage of the first and second conductors.

In accordance with another aspect of the invention, a medical imaging device is disclosed which includes a coil having a plurality of conductive plates and a controller configured to direct electrical charges to the plurality of conductive plates. An epoxy is disposed between adjacent conductive plates and means for resisting partial discharge is suspended in the epoxy between adjacent conductive plates.

Yet another aspect of the present invention discloses a method of forming a magnetic coil. The method includes the steps of securing a first conductive plate to a second conductive plate with an epoxy and suspending a plurality of selected particles in the epoxy generally uniformly between the first conductive plate and the second conductive plate.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
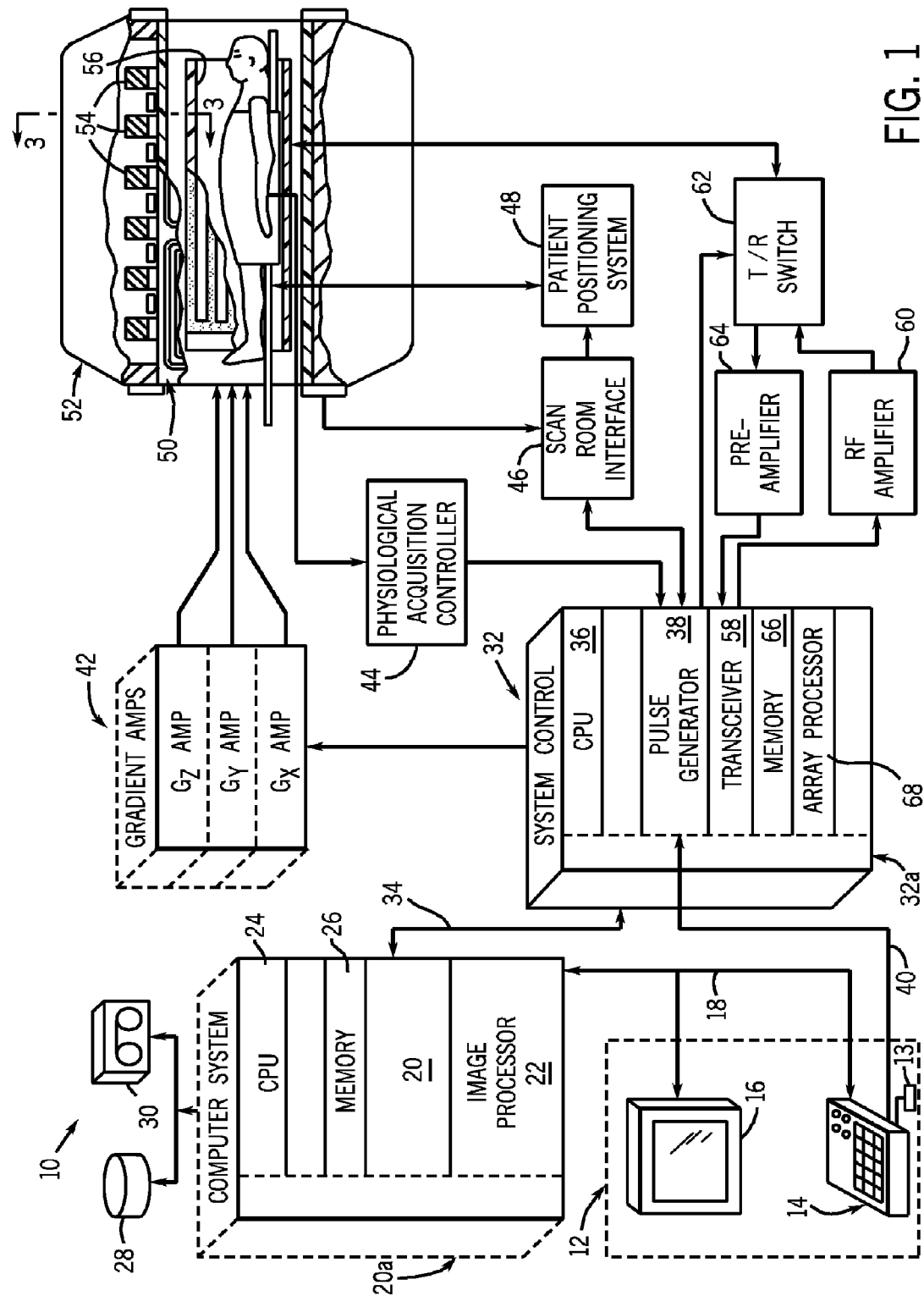
FIG. 1 is a schematic block diagram of an MR imaging system equipped with a coil according to the present invention.

Referring to FIG. 1, the major components of a preferred magnetic resonance imaging (MRI) system 10 incorporating the present invention are shown. Understandably, MRI system 10 is one of the envisioned applications of the present invention. One skilled in the art will appreciate that the present invention has applicability beyond the specific example of an MRI system discussed herein. That is, it is understood that the present invention is applicable to any electromagnetic coil application such as, for example, maglev trains, transformer construction, etc. This list is not exhaustive but is only indicative of the diverse applicability of the present invention. For brevity, the present invention is hereunder described as it relates to the medical imaging modality of MRI.

The operation of system 10 is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
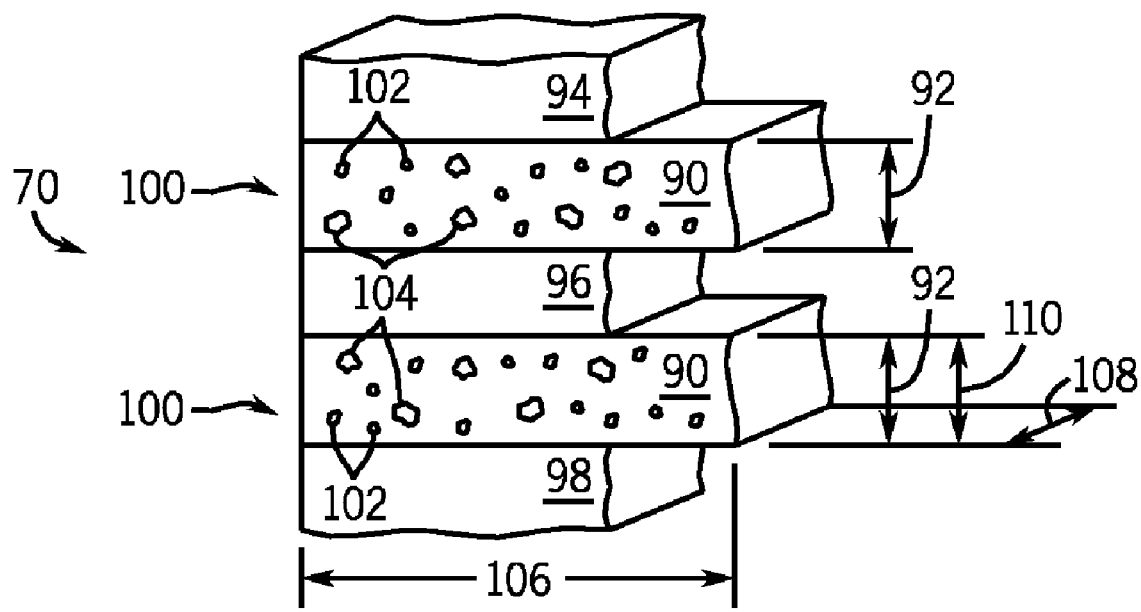
FIG. 2 is a cross-sectional view of a portion of the coil shown in FIG. 1.

A cross-section of a portion of a coil 70 of coil assembly 50 is shown in FIG. 2. Coil 70 includes a plurality of conductive plates 94, 96, 98 wherein each conductive plate is associated with an axis of the gradient coil. An epoxy layer 90 is disposed in a space 92 between adjacent conductive plates 94, 96, and 98. A plurality of particles 100 are generally uniformly distributed in epoxy layer 90 between adjacent plates of plates 94, 96, 98. Plurality of particles 100 include a plurality of nanoparticles 102 and a plurality of microparticles 104. Understandably, plurality of particles 100 could be entirely nano-sized particles, entirely micro-sized particles, or any mixed ratio thereof. Preferably, particles 100 are generally uniformly distributed throughout a width 106, a length 108, and a depth 110 of epoxy layer 90 between adjacent plates. In addition to the preference in their size, particles 100 are also preferably formed of any of $SiO_2$, $TiO_2$, MgO, Alumina, $BaTiO_3$, SiC, or ZnO. Understandably, this list of materials is not exhaustive and in no way limits the scope of the claimed invention. In addition to possibly mixing the sizes of particles 100, particles 100 in an epoxy layer 90 may include only one of these materials or may be any combination thereof. Preferably, plurality of particles 100 are formed of silicon dioxide. Understandably, the relative sizes of plates 94, 96, 98, spaces 92, and particles 100, 102, 104 are not to scale and have been modified to more clearly show assembled structure of coil 70.

During operation of coil 70, an electrical voltage is applied to plates 94, 96, 98 and particles 100 inhibit the partial discharge between adjacent plates 90 and increase the operational partial discharge inception voltage of coil 70. The increase in the partial discharge inception voltage is achieved by the increase in the ratio of the surface area of the particles to the volume of epoxy 90 between plates 94, 96, 98. The interface between particles 100 and epoxy 90 suppress the partial discharge between adjacent plates 94, 96, 98. Although the size of the bore defined by coil 70 could be increased by reducing space 92 between adjacent plates 94, 96, 98, simply reducing the thickness of epoxy layers 90 allows unacceptable partial discharge between adjacent plates and detrimentally affects the operational driving voltage of the coil. As such, simply reducing the distance between adjacent plates as defined by space 92 without addressing the partial discharge between plates would detrimentally affect image quality. Particles 100 allow reduced interlayer spacing without appreciable increase in partial discharge between adjacent plates.

Interlayer spacing of approximately a millimeter or less is envisioned with increased operable driving voltages, increased coil bore sizes, and decreased interlayer partial discharge through the utilization of the interlayer particle suspension. Accordingly, a medical imaging scanner according to the present invention allows for an increased patient bore opening, operation at elevated driving voltages, and generation of stronger gradients and faster slew rates without depreciation of image quality resulting from partial discharge of the coil.

The present invention has been described with respect to its applicability to a medical imaging device. Understandably, one of ordinary skill in the art will appreciate that the present invention is applicable to other applications. It is appreciated that the present invention is applicable to any electromagnetic coil application which would benefit from any of reduced interlayer partial discharge, greater operational driving voltages, and/or the generation of stronger gradients.

Therefore, in accordance with one embodiment of the invention, an electromagnetic coil includes a first conductor, a second conductor, and an epoxy disposed between the first conductor and the second conductor. A plurality of particles is generally uniformly suspended in the epoxy and increase a partial discharge inception voltage of the first and second conductors.

According to another embodiment of the invention, a medical imaging device includes a coil having a plurality of conductive plates and a controller configured to direct electrical charges to the plurality of conductive plates. An epoxy is disposed between adjacent conductive plates and means for resisting partial discharge is suspended in the epoxy between adjacent conductive plates.

A further embodiment of the invention is a method of forming a magnetic coil which includes the steps of securing a first conductive plate to a second conductive plate with an epoxy and suspending a plurality of selected particles in the epoxy generally uniformly between the first conductive plate and the second conductive plate.

The present invention has been described in terms of the preferred embodiment, and it is recognized that equivalents, alternatives, and modifications, aside from those expressly stated, are possible and within the scope of the appending claims.

What is claimed is:

1. An electromagnetic coil comprising:
   a first conductor;
   a second conductor;
   an epoxy disposed between the first conductor and the second conductor;
   a plurality of particles generally uniformly suspended in the epoxy to increase a partial discharge inception voltage of the first and second conductors; and
   wherein the plurality of particles are further defined as at least one of a plurality of microparticles, a plurality of nanoparticles, and a combination of microparticles and nanoparticles.

2. The electromagnetic coil of claim 1 wherein the plurality of particles are substantially uniformly distributed across at least one of a width, a length, and a depth of the epoxy and are configured to modify a partial discharge of the first conductor and second conductor.

3. The electromagnetic coil of claim 1 wherein at least one particle of the plurality of particles is one of $SiO_2$, $TiO_2$, MgO, Alumina, $BaTiO_3$, SiC, and ZnO.

4. The electromagnetic coil of claim 1 wherein the coil is configured to form a bore therethrough.

5. The electromagnetic coil of claim 1 further comprising a controller configured to control charging of the first conductor and the second conductor.

6. The electromagnetic coil of claim 5 wherein the charging of the first conductor and the second conductor is controlled to cause excitation in a patient.

7. The electromagnetic coil of claim 1 incorporated into a medical imaging device.

8. The electromagnetic coil of claim 7 wherein the electromagnetic coil is configured to impress gradient fields in a magnetic resonance imaging device.

9. A medical imaging device comprising:
   a coil having a plurality of conductive plates;
   a controller configured to direct electrical charges to the plurality of conductive plates;
   an epoxy disposed between adjacent conductive plates;
   means, suspended in the epoxy, for resisting partial discharge between adjacent conductive plates; and
   wherein the means for resisting partial discharge is at least one of a plurality of nanoparticles, a plurality of microparticles, and a mixture of nanoparticles and microparticles.

10. The medical imaging device of claim 9 wherein the means for resisting partial discharge is formed from a material which has properties substantially similar to one of $SiO_2$, $TiO_2$, MgO, Alumina, $BaTiO_3$, SiC, and ZnO.

11. The medical imaging device of claim 9 wherein a modality of the medical imaging device is magnetic resonance imaging.

12. The medical imaging device of claim 9 wherein the means for resisting partial discharge increases the partial discharge inception voltage of the conductive plates.

13. A method of forming a magnetic coil comprising the steps of:
   securing a first conductive plate to a second conductive plate with an epoxy;
   suspending a plurality of selected particles in the epoxy generally uniformly between the first conductive plate and the second conductive plate; and
   wherein the plurality of selected particles are selected from the group consisting of a plurality of nanoparticles, a plurality of microparticles, and a mixture of nanoparticles and microparticles.

14. The method of claim 13 wherein the plurality of selected particles increase a partial discharge inception voltage between the first conductive plate and the second conductive plate as compared to a magnetic coil lacking a plurality of particles.

15. The method of claim 13 wherein at least one of the plurality of particles is formed of at least one of $SiO_2$, $TiO_2$, MgO, Alumina, $BaTiO_3$, SiC, and ZnO.

16. The method of claim 13 further comprising configuring the first conductive plate and the second conductive to form a bore of a magnetic resonance imaging device.

17. The method of claim 16 further comprising energizing at least one of the first conductive plate and the second conductive plate to impress a gradient field about a patient passed into the bore.

18. The method of claim 17 further comprising obtaining an image of the patient in the magnetic resonance imaging device.

* * * * *